United States Patent
Cook et al.

(10) Patent No.: US 10,748,743 B1
(45) Date of Patent: Aug. 18, 2020

(54) DEVICE AND METHOD FOR OPERATING A CHARGED PARTICLE DEVICE WITH MULTIPLE BEAMLETS

(71) Applicant: ICT Integrated Circuit Testing Gesellschaft für Halbleiterprüftechnik mbH, Heimstetten (DE)

(72) Inventors: Benjamin John Cook, München (DE); Dieter Winkler, München (DE); Ralf Schmid, Poing (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/273,961

(22) Filed: Feb. 12, 2019

(51) Int. Cl.
| | |
|---|---|
| H01J 37/28 | (2006.01) |
| H01J 37/147 | (2006.01) |
| H01J 37/10 | (2006.01) |
| G01N 21/95 | (2006.01) |

(52) U.S. Cl.
CPC .......... *H01J 37/28* (2013.01); *G01N 21/9501* (2013.01); *H01J 37/10* (2013.01); *H01J 37/1474* (2013.01); *H01J 2237/0453* (2013.01); *H01J 2237/103* (2013.01); *H01J 2237/1534* (2013.01); *H01J 2237/2801* (2013.01)

(58) Field of Classification Search
CPC . H01L 37/1474; H01L 37/28; H01L 37/3177; H01J 2237/0453
See application file for complete search history.

(56) References Cited

U.S. PATENT DOCUMENTS

| | | | |
|---|---|---|---|
| 2015/0076362 A1* | 3/2015 | Sohda | H01J 37/1475 250/440.11 |
| 2015/0155134 A1* | 6/2015 | Frosien | H01J 37/09 250/310 |
| 2017/0213688 A1 | 7/2017 | Ren et al. | |
| 2019/0013176 A1 | 1/2019 | Breuer | |

FOREIGN PATENT DOCUMENTS

EP    2 879 155 B1    6/2015

OTHER PUBLICATIONS

International Search Report and Written Opinion for Application No. PCT/EP2020/051493, dated Apr. 23, 2020, 16 pages.

* cited by examiner

*Primary Examiner* — Eliza W Osenbaugh-Stewart
(74) *Attorney, Agent, or Firm* — Kilpatrick Townsend & Stockton LLP

(57) ABSTRACT

A method of operating a charged particle beam device is disclosed, including passing each of a plurality of beamlets through a deflector and a scanner, in that order. Each of the beamlets is focused with an objective lens on a sample to form a plurality of focal spots, forming an array. A first beamlet is focused on a first spot and a second beamlet is focused on a second spot. In a centered configuration of the device, each of the plurality of beamlets is directed by the deflector toward a coma free point. In a beamlet-displaced configuration of the device, the scanner is scanned such that the first beamlet passes through an acceptable aberrations point, the first beamlet scanning a displaced first field of view; and the first spot is displaced from the regular first focal spot to a displaced first focal spot.

21 Claims, 8 Drawing Sheets

DEVICE AND METHOD FOR OPERATING A CHARGED PARTICLE DEVICE WITH MULTIPLE BEAMLETS

TECHNICAL FIELD

Embodiments described herein relate to charged particle beam devices for use in inspection, defect detection, and/or critical dimensioning applications. Embodiments also relate to methods of operating a charged particle beam device, such as a device that includes more than one beamlet of charged particles. Multi-beam systems can be used for general purposes such as imaging, and for high throughput electron beam inspection (EBI). Embodiments also may relate to a scanning charged particle beam device and a method of inspection with a scanning charged particle beam device such as a scanning electron microscope (SEM).

BACKGROUND

Charged particle beam devices have many uses, such as inspection of semiconductor devices with nanometer scale features. Modern semiconductor technology is highly dependent on an accurate control of the various processes used during the production of integrated circuits. Accordingly, semiconductor wafers are inspected in order to detect problems. Furthermore, a mask or reticle can be subject to inspection in order to make sure that the mask or reticle accurately defines a desired pattern.

The inspection of wafers or masks for defects can include the examination of the whole wafer or mask area. Thus, there is a challenge to inspect a large area at high resolution. Also, it is desirable to perform inspection rapidly so that production throughput is not limited by the inspection process, if possible.

Scanning electron microscopes (SEM) have been used to inspect wafers. The surface of the wafer can be scanned using a finely focused electron beam. When the electron beam irradiates the wafer, secondary electrons and/or backscattered electrons, i.e. signal electrons, are generated and can be detected. A defect at a location on the wafer can be detected, for example, by comparing an intensity signal of the secondary electrons to a reference signal corresponding to the same location on the pattern.

Wafer and mask defect inspection in semiconductor technology benefits from high resolution and fast inspection tools, which may cover full wafer/mask application and/or hot spot inspection. Electron beams can be used to provide high resolution inspection of samples so as to be able to detect small defects. In particular, from the 20 nm node and beyond, the high-resolution potential of electron beam based imaging tools is in demand to detect many defects of interest.

However, because of the decreasing feature size and increasing demands for higher resolutions, scanning the entire surface of the wafer can take a long time. Accordingly, using a single-beam scanning electron microscope (SEM) for wafer inspection may not be ideal, because of throughput limitations. A multi-beam SEM is therefore desirable. For example, multiple beams, or beamlets, may allow for simultaneous inspection at multiple locations on the sample, increasing throughput. However, there can be many technical difficulties encountered when using a multi-beam system that require inventive solutions, such as difficulties with generation, control, and the operation of multiple charged particle beams.

SUMMARY

Herein is disclosed a method of operating a charged particle beam device (1), including passing each of a plurality of beamlets (4A, 4D) through a deflector (6) and a scanner (12). The beamlets pass through the scanner after passing through the deflector. Each of the beamlets is focused with an objective lens on a sample to form a plurality of focal spots, forming an array. A first beamlet is focused on a first spot and a second beamlet is focused on a second spot. In a centered configuration of the device, each of the plurality of beamlets is directed by the deflector toward a coma free point on a virtual plane perpendicular to an optical axis; the first spot (40A) is a regular first focal spot (40A) formed by the first beamlet (4A); and the scanner is scanned. In a beamlet-displaced configuration (FIG. 4) of the device, the scanner is scanned, optionally in synchronicity with the deflector, such that the first beamlet (4A) passes through an acceptable aberrations point 105 on the virtual plane (210), the first beamlet 4A scanning a displaced first field of view 405A; and the first spot (40A or 45A) is displaced from the regular first focal spot (40A) to a displaced first focal spot (45A).

Herein is disclosed a charged particle beam device including a charged particle source and a multi-aperture plate, the multi-aperture plate including a plurality of apertures, each aperture for passing a beamlet, the multi-aperture plate forming a plurality of beamlets of charged particles. The device also includes a deflector; a scanner; and an objective lens configured to focus the plurality of beamlets on a plurality of focal spots to form an array, including a first beamlet focused on a first spot and a second beamlet focused on a second spot. The charged particle beam device has a centered configuration and a beamlet-displaced configuration. In the centered configuration, the deflector is configured to direct each of the plurality of beamlets toward a coma free point on a virtual plane perpendicular to an optical axis, and the plurality of focal spots include the first spot which is a regular first focal spot formed by the first beamlet. In the beamlet-displaced configuration, the scanner and deflector are each configured to be scanned such that the deflector deflects the first beamlet through an acceptable aberrations point on the virtual plane, and the first beamlet scans a displaced first field of view, and the first spot is displaced from the regular first focal spot to a displaced first focal spot.

Embodiments are also directed at apparatuses for carrying out the disclosed methods and include apparatus parts for performing each described method features. The method features may be performed by way of hardware components, such as a computer and/or controller. The computer and/or controller may be configurable, programmable, configured, and/or programmed, such as by appropriate software. Furthermore, embodiments are also directed at methods which can be carried out by the described apparatus. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following, the charged particle beam device or components thereof can be referred to as a charged particle beam device, or "device," which may include components for the detection of secondary or backscattered particles, such as electrons. Embodiments can include apparatuses and components that may detect secondary and/or backscattered charged particles in the form of electrons, ions, photons, X-rays and/or other signals which may be used to obtain a specimen image. As described herein, discussions and descriptions relating to the detection are exemplarily described with respect to electrons in scanning electron microscopes. Other types of charged particles, e.g. positive ions, can be detected by the device in a variety of different instruments.

Herein, a primary charged particle beam or a primary charged particle beamlet can be generated by a particle beam source and can be guided to a specimen to be inspected and/or imaged.

Herein a beam can be a primary beam; a beamlet can be a primary beamlet. A primary beam or beamlet is for irradiating a sample. A primary beamlet may be one which is for irradiating a sample.

According to embodiments herein, which can be combined with other embodiments, a signal beam of charged particles can refer to a beam of secondary particles and/or backscattered particles. Typically, the signal beam or secondary beam is generated by the impingement of the primary beam or primary beamlet on a specimen and/or by backscattering of the primary beam from the specimen.

A "specimen" or "sample" as referred to herein, includes, but is not limited to, semiconductor wafers, semiconductor workpieces, photolithographic masks and other workpieces such as memory disks and the like. Embodiments may be applied to any workpiece on which material is deposited or which is structured. A specimen can include a surface to be structured or on which layers are deposited, an edge, and typically a bevel.

Figure 1:
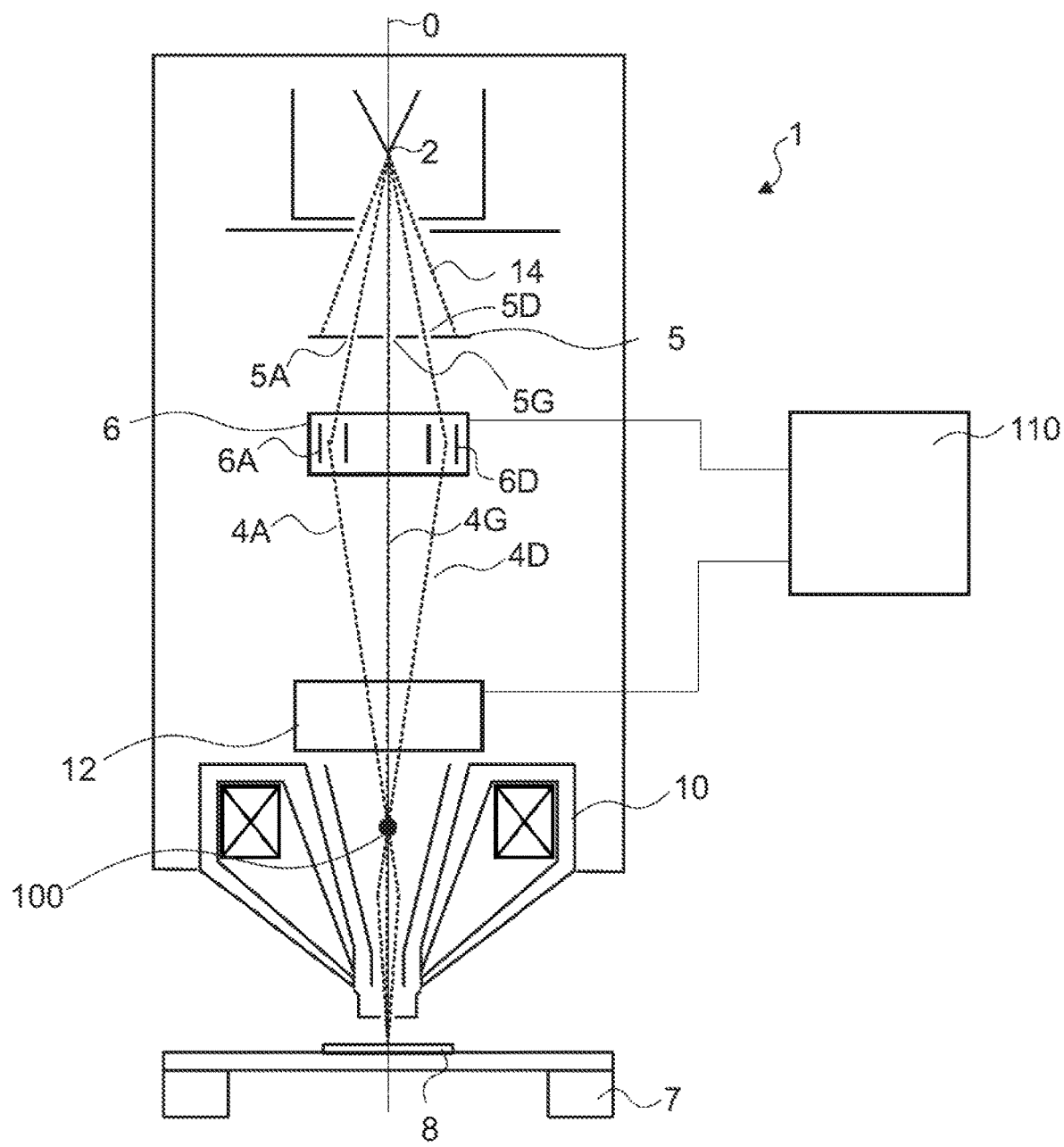
FIG. 1 shows a schematic drawing of a charged particle beam device according to embodiments described herein.

FIG. 1 shows, according to an embodiment, a charged particle beam device 1 including a plurality of charged particle beamlets 4A, 4D, 4G. The device can be used for sample inspection. The charged particle beam device 1 includes a charged particle source 2, which can generate charged particles which are directed to a multi-aperture plate 5. The apertures 5A, 5D, 5G of the multi-aperture plate 5 each can pass beamlets 4A, 4D, 4G. Each of the beamlets may pass through a scanner 12 after passing through a deflector 6.

The beamlets can be focused by an objective 10 to form a plurality of focal spots 40A, 40D. The first beamlet 4A is focused on a first spot 40A, and a second beamlet 4D is focused on a second spot 40D.

The charged particle beam device 1 includes a deflector 6, which can include deflector elements 6A, 6D which may, respectively, direct beamlets 4A, 4D toward the objective lens 10. The deflector elements 6A, 6D, may be addressable by a controller 110. The deflector elements 6A, 6D can be configured so that each passes one of the beamlets. The deflector elements 6A, 6D can include a first deflector element 6A, and a second deflector element 6D. The first deflector element 6A can pass the first beamlet 4A. The second deflector element 6D can pass the second beamlet 4D. The MEM can be operated so as to energize each deflector element simultaneously. The deflector 6 can include a MEM. The MEM can be configured to generate an electrical multipole such as a dipole, quadrupole, hexapole, octupole, and/or higher multipole at each deflector element 6A, 6D.

The controller 110 may address each deflector element 6A, 6D. The controller 110 can send a first signal to the first deflector elements 6A, and send a second signal to the second deflector element 6D. The first signal and the second signal may be identical or may be different. The second signal may be identical with additional signals sent by the controller 110 to additional deflector elements of the deflector 6. The controller 110 can control each deflector element 6A, 6D, for example, such that each deflector element 6A, 6D receives a unique signal, or receives the same signal.

The deflector 6 may cause the beamlets to appear to come from spatially separate sources. Alternatively/additionally, the charged particle beam device 1 may include a condenser lens (not shown) which may be placed, for example, between the source 2 and the multi-aperture plate 5. The condenser lens may guide the charged particles directly to the multi-aperture plate 5. Alternatively/additionally, a condenser lens may be placed after the multi-aperture plate 5, such as immediately after the multi-aperture plate 5. A condenser lens may collimate the charged particles and/or guide them, directly or indirectly, toward the objective 10.

The deflector 6 and the scanner 12 can be configured for synchronization, and a lenslet 300 or lenslet array may also be synchronized with the deflector and/or scanner. The controller 110 can synchronize the scanning of a scanner 12 and the scanning of the deflector 6, as well as the optional lenslet 300 or lenslet array. The controller 110 can control the configuration of the charged particle device 1, such as switch between a centered configuration and a beamlet-displaced configuration.

The deflector 6 and/or scanner 12 can move the charged particle beamlets 4A, 4D, 4G over a sample 8. The sample 8 may be on a stage 7, such as a translatable stage, which may also aid in moving the sample 8 so as to aid in the imaging and/or inspection of the sample 8.

When the beamlets 4A, 4D, 4G strike the surface of the sample 8, they can undergo interactions with the sample. The interactions can produce a variety of emissions, such as electrons, X-rays, heat, and light. Many of these emissions can be used to produce the images of the sample and/or to collect data from the sample 8. An emission of interest for examination or image formation is from signal electrons that escape from the sample 8 at a variety of angles with relatively low energy (1 to 50 eV). Signal electrons, including backscattered and/or secondary electrons, can be collected from the specimen through the objective lens 10. Secondary electrons can be separated from the backscattered electrons and/or the beamlets 4A, 4D, 4G in a beam separator assembly, which can be placed in the optical path so that signal electrons collected by the objection 10 can be directed to a detector assembly. The detector assembly can include detector elements which can be configured for generation of a measurement signal, e.g. an electronic signal corresponding to detected signal electrons. A computer and/or the controller can receive data generated by the device.

By irradiating the specimen with the beamlets 4A, 4D, 4G and displaying and/or recording the output of the detector assembly, data for inspection/testing of the sample can be provided, including multiple images of the surface of the sample 8. Each image can provide information about a different portion of the surface of the sample. Accordingly, in comparison to single beam devices, the speed of data acquisition can be increased by use of multiple beamlets. The stage 7 (or sample support) can be moveable, such as horizontally movable in all directions. This may allow the beamlets 4A, 4D, 4G to reach target areas on the sample which are to be examined.

FIG. 1 also shows a coma free point 100, which is depicted as being in the objective 10. A coma free point 100 may alternatively be located in the scanner 12 or between the scanner and the objective 10. The beamlets 4A, 4D, 4G are seen to pass through the coma free point 100. By passing through the coma free point 100, aberrations can be reduced and/or minimized, and the focused beamlet spot size may be reduced and/or minimized for improvement in resolution. The scanner 12 can operate so as to dynamically shift the beamlets 4A, 4D, such that they pass intermittently and/or periodically through the coma free point 100 during a scan.

The scanner 12 can add aberrations, such as astigmatism, coma, and field curvature aberrations. The scanning range, which can determine the dimension of the field of view, can be determined and/or selected based on an acceptable amount of aberration and/or loss of resolution. Greater range and/or field of view may lead to greater aberration, greater beamlet focal spot size, and worsening resolution.

In an example, an array of focal points of beamlets extends to a range of approximately 80 μm radius, e.g. an array of beamlets lies on a virtual ring at a radius of around 80 μm; a field of view, of one of the beamlets, can be approximately ±5 μm. If the scanning range is greater than that, it can lead to significant loss of spatial resolution, such as an increase of spot size of 5% or larger. The scanner 12 can add significant aberration. Alternatively/additionally, the operation of the scanner can be limited so as to preserve resolution, or at least to preserve acceptable resolution. For example, if the beamlets 4A, 4D are scanned relatively far from the coma free point 100, intermittently and/or periodically, the spot sizes of the beamlets increase at positions far from the coma free point 100, and the resolution, particularly near the outer edges of the fields of view, can become worse. At relatively high scanning ranges, the beamlet aberrations can reach unacceptably high levels, such that the spot size becomes unacceptably high and the resolution unacceptably poor. What is acceptable and is not acceptable can be predetermined or selected.

In an embodiment, the range of the scanning by the scanner 12 can be limited so that the aberrations are no more than acceptable, such as limiting the aberrations so that the spot size is increased by less than 1%, 2%, 5%, or 10% from the spot size when the beam passes through the coma free point 100. If we define a virtual plane 210 (see FIG. 2) perpendicular to the optical axis 0, an acceptable aberrations point 105 can be defined as a point on the virtual plane 210 that includes a coma free point 100. An acceptable aberrations point 105 can be a point on the virtual plane 210, through which a beamlet may pass, which can result in a spot size of the focused beamlet being increased by less than a predetermined amount above that of the beamlet passing through the coma free point 100; the predetermined amount can be 10%, 5%, 2%, or 1%.

The scanner 12 can dynamically shift the beamlets 4A, 4D from the coma free point 100, which can add stigmatism, coma, and field curvature. It can be technically challenging to find methods of operation, and associated arrangement of hardware such as optics and controllers, that can minimize aberrations while providing a charge particle device that can operate with a large field of view with excellent spatial resolution capabilities, especially when rapid throughput is desired as in semiconductor inspection applications.

Figure 2:
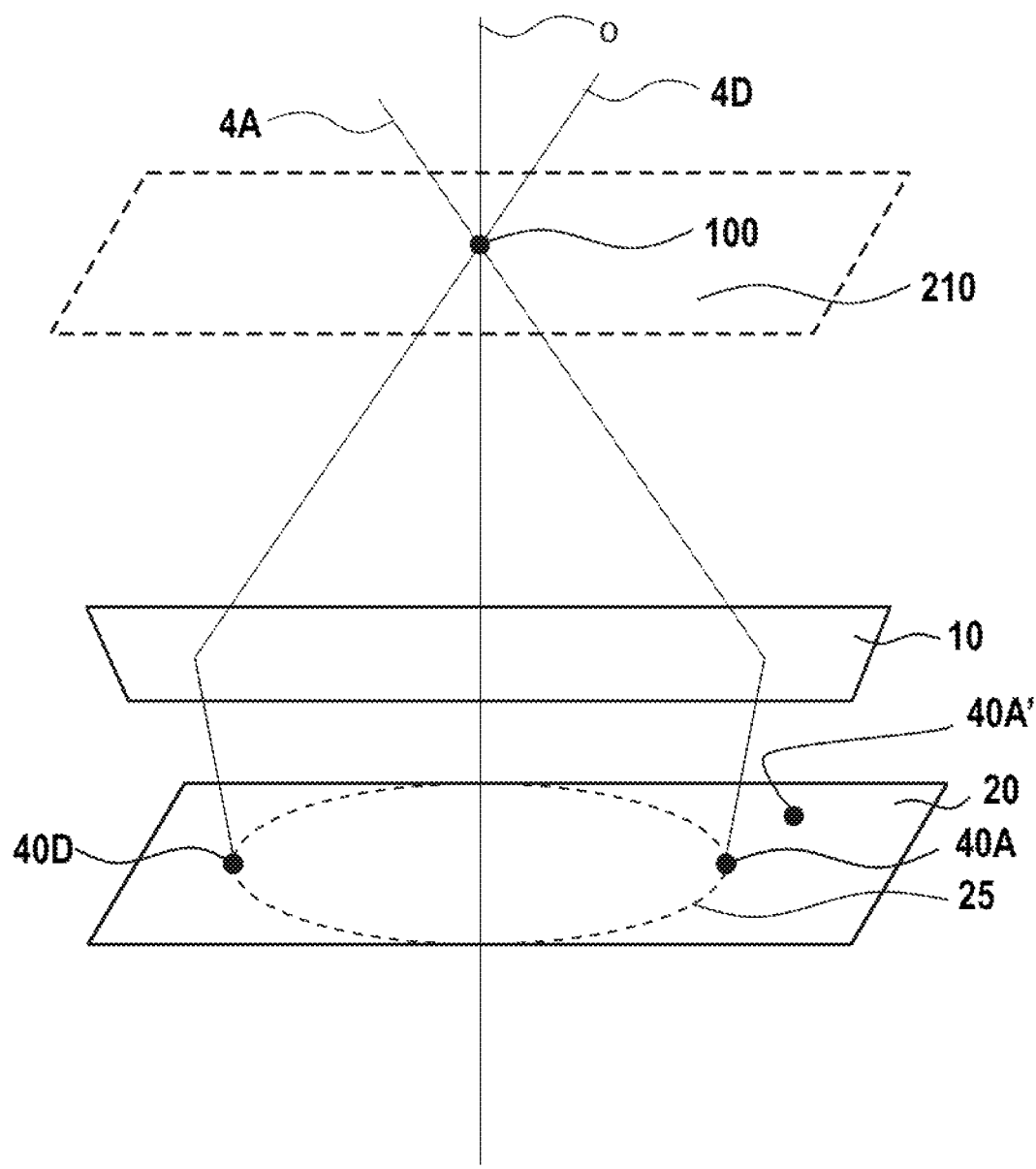
FIG. 2 illustrates part of a charged particle device in a centered configuration, according to embodiments described herein.

FIG. 2 illustrates a centered configuration of the device, according to embodiments described herein. In the centered configuration of the device, the deflector 6 directs each of the plurality of beamlets 4A, 4D toward a coma free point 100 on a virtual plane 210.

A coma free point may be located in the field of the objective lens 10, such as in the objective lens 10 (as seen in FIG. 1, for example), i.e. not in a field-free region, for example. A coma free point 100 may lie on the optical axis 0. The coma free point 100 may be located in the scanner 12, such as the center of the scanner 12. The coma free point 100 may be located between the objective 10 and the scanner 12. The coma free point may be located in the field of at least one of the scanner 12, the objective lens 10, and an electrostatic lens used to decelerate the charged particle beam before the beam strikes the sample, or at a position between the fields of the scanner 12, the objective lens 10, and the electrostatic lens for deceleration.

FIG. 2 illustrates the beamlets 4A, 4D being focused by the objective lens 10 to form a plurality of focal spots 40A, 40D. The first beamlet 4A is focused on a first spot 40A and the second beamlet 4D is focused on a second spot 40D. The plurality of focal spots can form an array, such as a regularly spaced array. As seen in FIG. 2, the focal spots can lie on a virtual ring 25, which can be centered on the optical axis 0. The focal spots 40A, 40D may lie on a focal plane 20, such as one that is perpendicular to the optical axis 0.

The first spot 40A, when the device is in the centered configuration, is referred to as a regular first focal spot 40 A.

In an embodiment that can be combined with other embodiments described herein, the beamlets can be scanned such that the beamlets pass through the coma free point 100, such as by operation of the scanner 12 and the deflector 6, particularly by scanning the scanner 12 and deflector 6 in synchronicity.

Figure 3A:
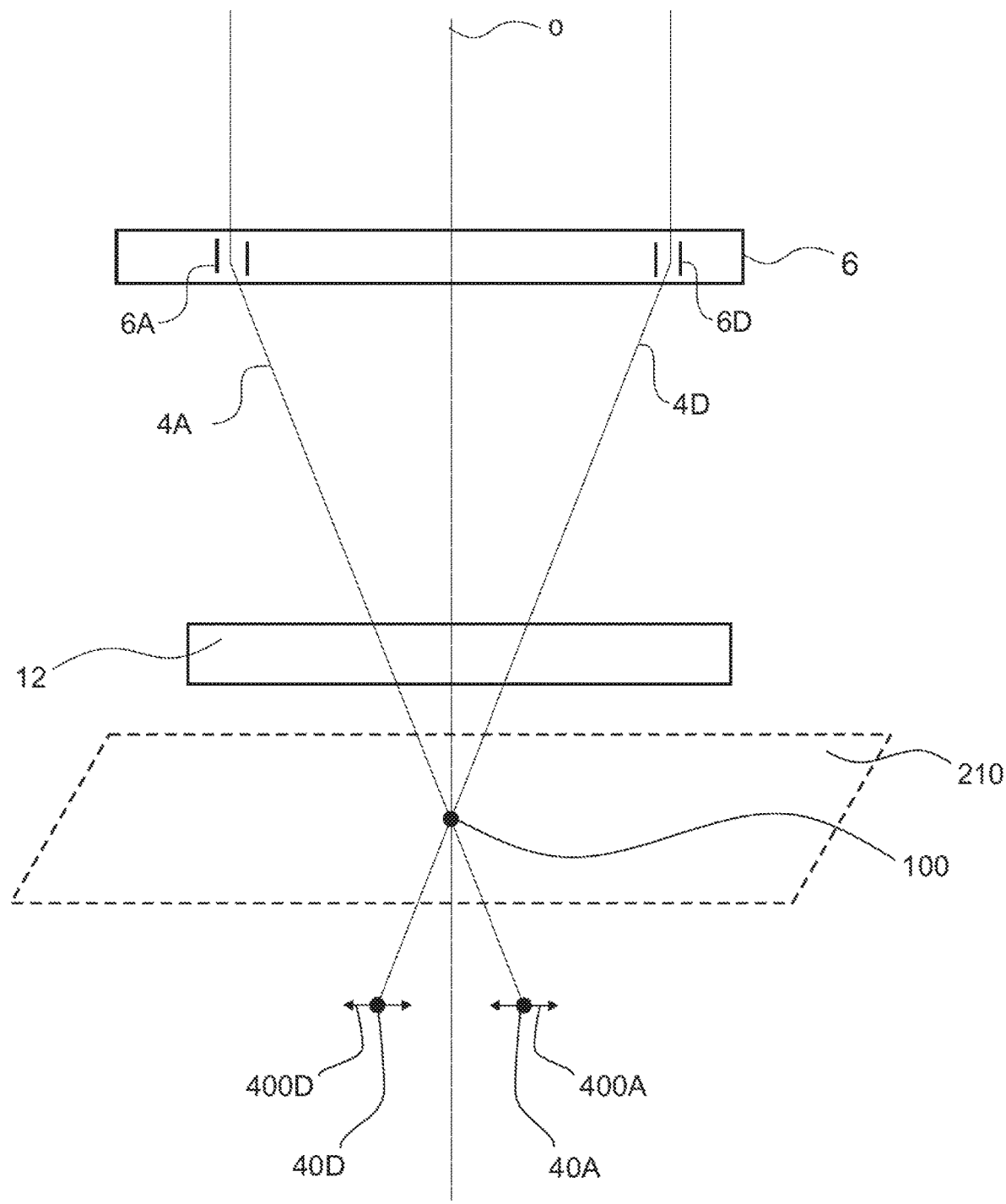
FIG. 3A illustrates part of a charged particle device in a centered configuration, according to embodiments described herein.

FIG. 3A illustrates a centered configuration of the device, according to embodiments described herein. FIG. 3A shows the virtual plane 210 that includes the coma free point 100, and the focal spots 40A, 40D of the beamlet 4A, 4D. The objective lens 10 is not shown in FIG. 3A for simplification of the description. The objective lens 10 is understood to be placed after the scanner 12. In the centered configuration, the regular first focal spot 40A can be centered in a first field of view, which can be regarded as a regular first field of view 400A. The second beamlet 4D can form a second focal spot 40 D which can be centered in the second field of view 400D. The deflector 6 can direct each of the beamlets 4A, 4D toward the coma free point 100. The scanner 12 can scan the beamlets 4A, 4D such that the respective fields of view 400A, 400D of the first and second beamlets 4A, 4D, are irradiated by the beamlets 4A, 4D during scanning, while the charged particle device is in the centered configuration.

Figure 3B:
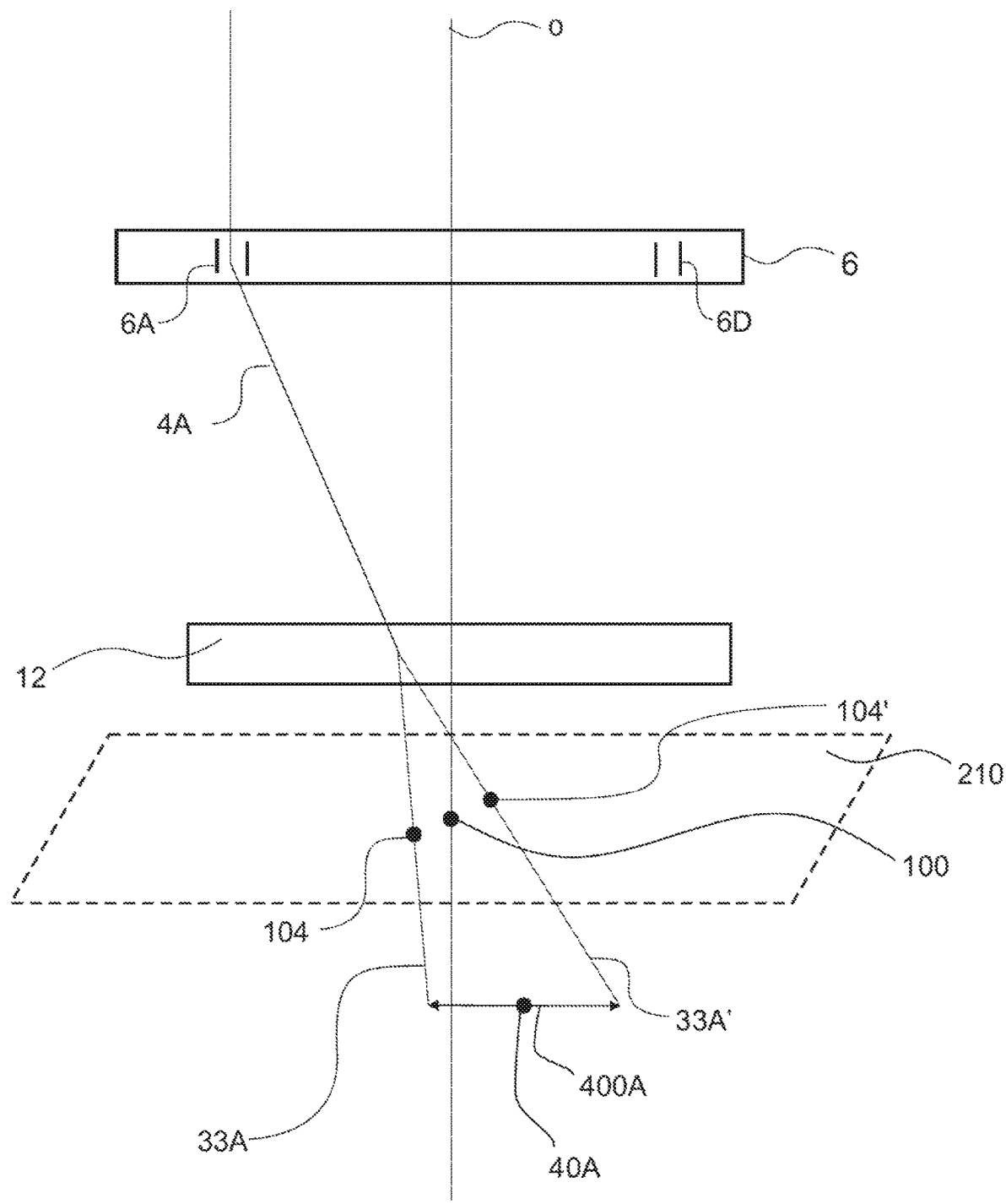
FIG. 3B illustrates part of a charged particle device in a centered configuration, according to embodiments described herein.

FIG. 3B illustrates a centered configuration of the device, according to embodiments described herein. In the centered configuration, at least the first beamlet 4A, such as each beamlet 4A, 4D, that is directed toward the coma free point 100 by the deflector 6 can be dynamically shifted by the scanner 12 away from the coma free point 100, such as during scanning. Each of the beamlets 4A, 4D, including those that are directed toward the coma free point 100 by the deflector 6, may be shifted by the scanner 12 during scanning. The operation of the scanner 12 on a beamlet may result in the beamlet passing through the virtual plane 210 at a point displaced from the coma free point 100. Each beamlet 4A, 4D may intermittently and/or periodically pass through the coma free point 100, such as in synchronicity with the scanning frequency.

The scanner 12 may be arranged so as to dynamically shift each beam approximately equally, causing approximately the same dynamic shift for each beam. The regular first and second focal spots 40A, 40D can be positioned such that the first and second beamlets 4A, 4D each pass through the coma free point 100 during scanning. The regular first and second focal spots 40A, 40D can be within respective fields of view, such as within a first field of view 400A and a second field of view 400D, respectively, as shown in FIGS. 3A and 3B. The regular first and second focal spots 40A, 40D can be centered within their respective fields of view, the first field of view 400A and the second field of view 400D.

If the deflector 6 statically deflects (and/or directs) the first beamlet 4A toward an acceptable aberrations point 105, and the scanner 12 dynamically shifts the beamlets 4A, 4D, then the first beamlet 4A can pass through the virtual plane 210 at points that oscillate around the acceptable aberrations point 105. If the oscillations are too great, it may lead to an undesirable increase in spot size and loss of resolution.

In FIG. 3B, the first beamlet 3A is shown as being deflected by the scanner, forming beampaths 33A and 33A'. The beampaths 33A, 33A' can cross the virtual plane 210 at points that are displaced from the coma free point 100, reaching the edges of the regular field of view 400A. The range of the scan, and/or the field of view 400A, 400D, can be limited to a predetermined range. The predetermined range can be based on an acceptable increase of the spot size, which may correlate with a tolerable loss of resolution at the edge of the field of view.

The increase of spot size, and loss of resolution, tends to scale with the magnitude of the displacement of the beamlet from the coma free point on the virtual plane 210. It can be useful to determine the limit of scan parameters such as the field of view 400A by reference to the acceptable aberrations point 105 (see FIG. 4). For example, in the centered configuration, the regular first field of view 400A of the first beamlet 4A may be limited such that when the first beamlet 4A reaches an edge of the regular first field of view 400A, it passes through acceptable aberrations points 104, 104' of the centered configuration.

The scanner 12 can deflect the beamlets 4A, 4D such that at maximum deflection by the scanner 12, the beamlets 4A, 4D reach an acceptable aberrations point. The range of the fields of view 400A, 400D of the beamlets 4A, 4D can be determined by the acceptable aberrations point, and/or the associated loss of resolution for beamlets that pass through the virtual plane at maximum deflection.

The scanner 12 can be a multipole, such as a hexapole, octupole, or higher. The charged beam device is configured such that, for each beam, an individual stigmatic and multipole (such as hexapole or higher) correction can be applied, such as by adjusting the deflector elements 6A, 6D corresponding to each beamlet 4A, 4D.

It can be technically difficult to direct a beamlet at a region of interest that is outside the regular fields of view of the beamlets without a significant loss of resolution. Hot spots or other regions of interest may be relatively poorly resolved in some configurations of a charged particle device.

Figure 4:
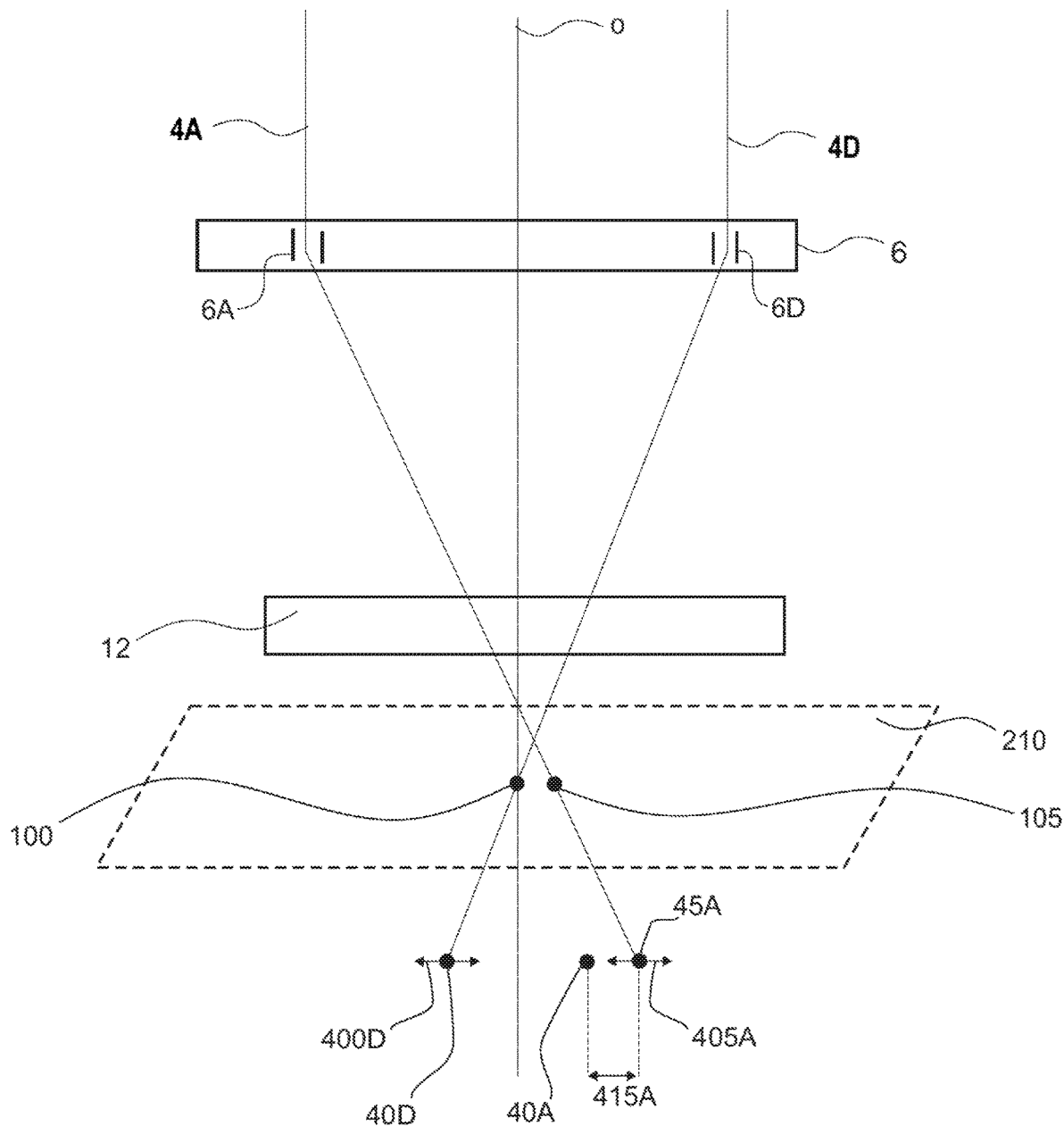
FIG. 4 illustrates part of a charged particle device in a beamlet-displaced configuration, according to embodiments described herein.

FIG. 4 illustrates a beamlet-displaced configuration of the charged particle beam device 1, according to embodiments described herein. As in FIGS. 3A and 3B, the objective lens 10 is not shown in FIG. 4 in order to simplify the description. The objective lens 10 is understood to be below the scanner 12. In the beamlet-displaced configuration, the deflector 6 can deflect the first beamlet 4A toward an acceptable aberrations point 105 while the deflector 6 deflects the second beamlet 4D toward the coma free point 100, as seen in FIG. 4.

In the beamlet-displaced configuration, the acceptable aberrations point 105 can be displaced from the coma free point 100. The focal spot of the first beamlet 4A can be displaced from the regular first focal spot 40A (cf. FIG. 3) to a displaced first focal spot 45A. There can be a maximum beamlet shift of the first focal point which is related to the acceptable aberrations point 105 and/or the predetermined acceptable increase in spot size (e.g. 1, 2, 5, or 10%), such as for the centered configuration.

In the beamlet-displaced configuration, the first beamlet 4A can be used to irradiate and/or image a region of interest such as a hot spot or the like, while the second beamlet 4D, or any number of the other beamlets of the plurality, may operate similarly/identically as in the centered configuration. In other words, it is possible to direct one of the beamlets, the first beamlet 4A, for example, at a region of interest such as at a hot spot, while other beamlets of the array 4D, 4G may continue to operate as in the centered configuration. It can be advantageous if each of the deflector elements 6A, 6D for each of the beamlets 4A, 4D are individually addressable. The deflector 6 may be configured so as to deflect each of the beamlets 4A, 4D individually, such as independently of the others.

In the beamlet-displaced configuration, the scanner 12 and the deflector 6 can be scanned such that the first beamlet 4A passes through an acceptable aberrations point 105 on the virtual plane 210. The scanning can be such that the first beamlet 4A is continually passing through the acceptable aberration point 100 during the scan. Alternatively, the scanning can be performed such that the first beamlet 4A oscillates about the acceptable aberration point 100 in synchronicity with the scanning, such as if the deflector 6 statically directs the first beamlet 4A toward the acceptable aberrations point 105; the first beamlet 4A may intermittently or periodically pass through the acceptable aberrations point.

The displaced first focal spot 45A can be directed at a hotspot and/or position of the sample 8 that is of particular interest. It is desirable to be able to adjust at least one beamlet of the array, such as an arbitrary beamlet of the array, to be able to irradiate a spot of interest or "hot spot." A hot spot or the like may lie at a position which each of the beamlets 4A, 4D, in the usual configuration of the charged particle device, would not be able reach without significant loss of resolution due to significant aberrations. It can be desirable to operate the charged particle device so that resolution losses are minimized even when irradiating/imaging hot spots which may lie at arbitrary locations on the sample.

As illustrated in FIG. 4, the displaced first spot 45A can be centered in a displaced field of view 405A of the first beamlet 4A. The second spot 40D may be centered in the second field of view 400D formed by the second beamlet 4D. The second spot 40D and/or second field of view 400D may be indistinguishable in the centered and beam-displaced configurations of the charged particle beam device 1. The deflector 6 may direct the first beamlet 4A toward the acceptable aberrations point 105.

In the displaced-beamlet configuration, the first beamlet 4A can irradiate a displaced first field of view 405A. The displaced first spot 45A can be displaced by a first beamlet shift 415A from the regular first focal spot 40A. In the displaced-beamlet configuration, the deflector 6 can move the first beamlet 4A toward a hot spot or the like that is not on the regular array (or ring, for example) formed by the plurality of beamlets 4A, 4D. In other words, in the beamlet-displaced configuration, the first spot of the first beamlet 4A can be displaced from the array of focal spots formed by the beamlets, or, displaced from the ring in the case that the plurality of focal spots in the centered configuration forms a ring.

Disclosed herein are methods and apparatuses exploiting multiple deflections of a beamlet (e.g. the first beamlet), particularly in the displaced-beamlet configuration, to optimize the beamlet path, meeting possible objectives such as reducing noise, maintaining acceptable resolution, minimizing aberrations, and/or increasing scan rate, particularly when the beamlet is to be used to irradiate/image a hot spot.

Figure 5:
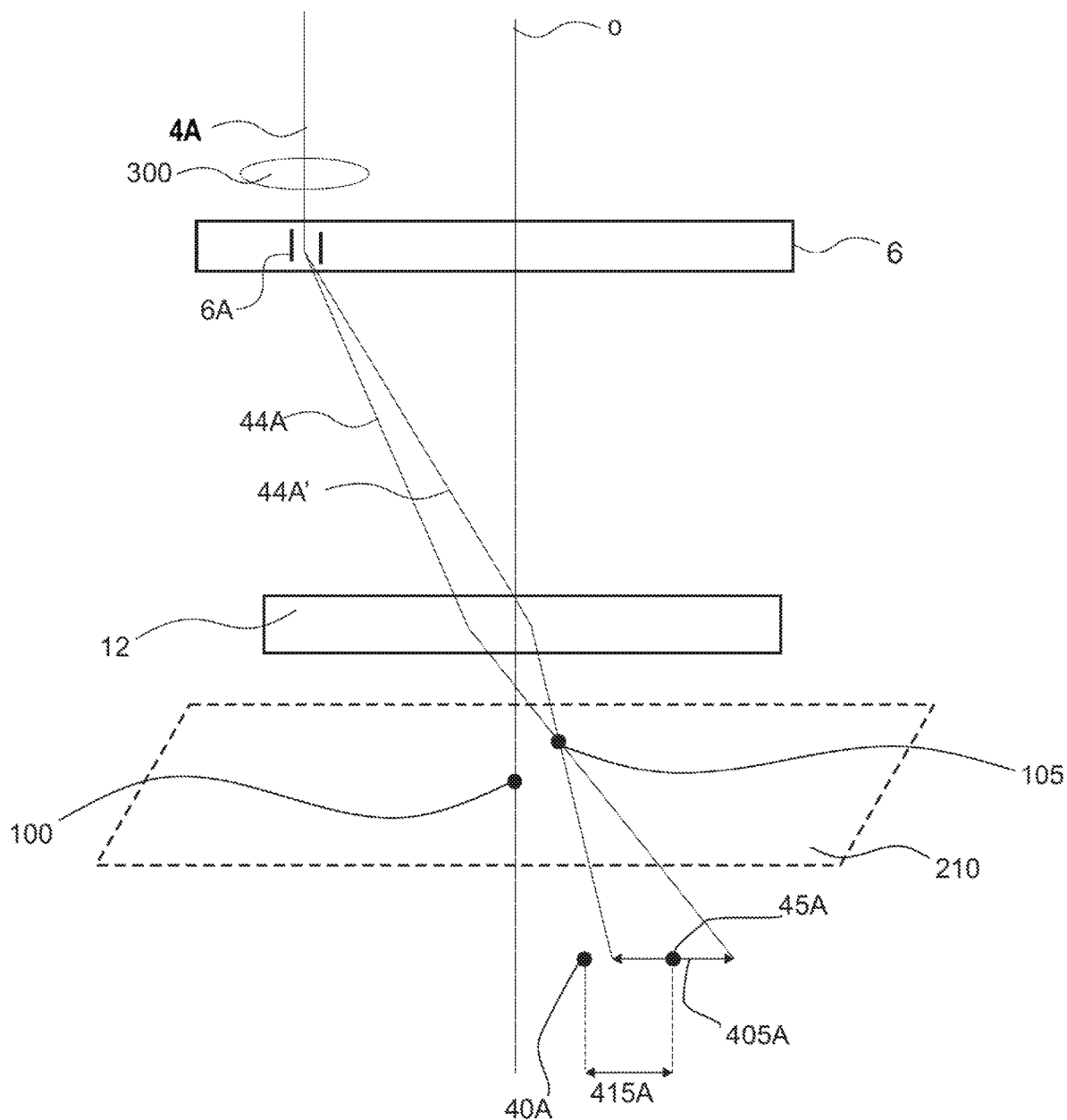
FIG. 5 illustrates part of a charged particle device in a beamlet-displaced configuration, according to embodiments described herein.

FIG. 5 illustrates, according to embodiments disclosed herein, a displaced-beamlet configuration of the charged particle device. A displaced field of view 405A can irradiated by the first beamlet 4A, which can pass continually through an acceptable aberrations point 105 on the virtual plane 210. The deflector 6 can direct the first beamlet 4A toward the acceptable aberrations point 105, taking into account the deflection due to the scanner 12. FIG. 5 illustrates two optical paths 44A, 44A' of the first beamlet 4A, each reaching an edge of the field of the displaced field of view 405A will of the first beamlet. The deflector elements 6A can deflect the first beamlet 4A along the optical paths 44A, 44A' to reach the edges of the displaced field of view 405A. The displaced first focal spot 45A can lie in the displaced field of view 405A, such as in the center thereof. The scanning of the deflector 6, or more particularly the scanning of the first deflector element 6A can compensate for the deflection of the scanner 12 such that the first beamlet 4A passes continually through the acceptable aberrations point 105. In other words, the deflector 6 can be scanned in synchronicity with the scanner 12 such that the first beamlet 4A passes continually through an acceptable aberrations point 105 and the other beamlets 4D, 4G are directed statically toward the coma free point 100.

In yet another embodiment, the deflector 6 is scanned in synchronicity with the scanner 12 such that the first beamlet passes continually through an acceptable aberrations point 105 and the other beamlets 4D, 4G are directed statically toward the coma free point 100. In an embodiment that can be combined with any other embodiments disclosed herein: each of the beamlets of the plurality 4A, 4D is scanned by the scanner 12; the first beamlet 4A is scanned by the deflector 6; and the second beamlet 4D is statically deflected by the deflector 6 toward the coma free point 100.

FIG. 5 also shows a lenslet 300 that can correct for field curvature aberrations of the first beamlet 4A. There can be an array of lenslets for each beamlet 4A, 4D of the plurality of beamlets 4A, 4D, for correcting field curvature of the respective beamlets. Each lenslet of the lenslet array may be addressable by the controller 110, and may scanned in synchronicity with the scanner 12 and/or deflector 6. Correcting field curvature of the first beamlet 4A or of any of the beamlets can be synchronized with the scanning of the scanner 12 and/or deflector 6. Each of the lenslets, such as the lenslet 300 for the first beamlet 4A can be scanned in synchronicity with the scanner and/or deflector.

Pre-deflection of the beamlet(s) by the deflector 6, as illustrated in FIG. 5, can keep the beamlet(s) at the acceptable aberrations point 105 when irradiating a region of interest, such as a hot spot outside the regular field of view of any of the beamlets in the centered configuration. Dynamic stigmatic and hexapole corrections can further extend the respective fields of view of the beamlets of the plurality of beamlets. As an example, a field of view which may be achievable when the beamlet is pre-deflected by the deflector has a range of around 5-10 µm.

The controller may include electronics configured to address each of the deflector elements 6A, 6D of the deflector 6. The controller may provide rapidly switching voltages for the subelements (such as poles) of the deflector elements 6A, 6D of the deflector 6. The controller may provide signals and/or power suitable for deflecting the beamlets 4A, 4D by at least one of the deflector elements 6A, 6D in synchronicity with the scanner 12. The relative phase and amplitude of the synchronized control and or power signals to the deflector 6 and scanner 12 (and optionally a lenslet array) may be adjustable.

Each deflector element 6A, 6D can be configured to pass one of the beamlets 4A, 4D. The deflector can include a MEM configured to generate an electrical dipole or higher at each deflector element 6A, 6D of the deflector 6. The MEM can be configured to simultaneously generate a dipole, quadrupole, and hexapole at each deflector element 6A, 6D. For example, each deflector element 6A, 6D, includes 8 or more poles/electrodes, particularly to generate simultaneously a dipole, quadrupole, and hexapole. Higher order MEMs are also contemplated, such as MEMS which include deflector elements 6A, 6D of up to 20 poles/electrodes or even higher, for example.

Each deflector element 6A, 6D can be configured to generate fields statically and/or dynamically (including superpositions of static fields and dynamic fields), such as can be determined by signals and/or power from the controller. Each deflector element 6A, 6D may be configured to be operated, such as by the controller, in unison with or independently of other deflector elements.

For an array of beamlets arranged in a virtual ring of 80 µm radius, the dynamic correction of field curvature by the lenslet 300 (and/or array of lenslets), and the dynamic pre-deflection by the deflector 6 can extend the possible shift of a beamlet toward a region of interest (or hotspot) from the regular focal spot by up to approximately 20 µm, and allow a field of view of each beamlet to be approximately 20 µm. It is advantageous to have large deviations possible from the regular array, and large possible fields of view, at acceptable losses of resolution.

Figure 6:
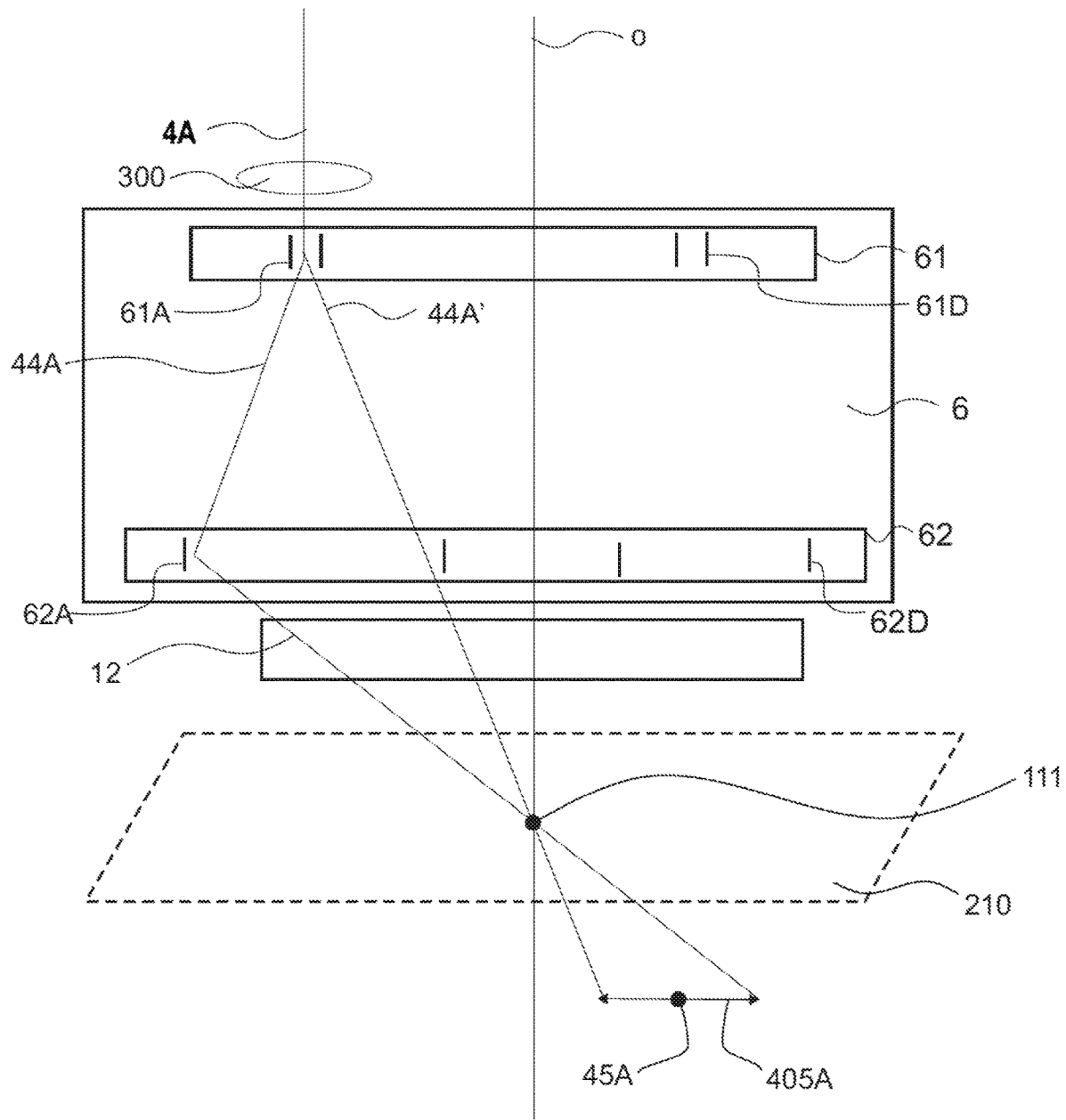
FIG. 6 illustrates part of a charged particle device in a beamlet-displaced configuration, according to embodiments described herein.

FIG. 6 illustrates a displaced-beamlet configuration, according to embodiments described herein. For clarity, the objective lens 10 is not shown, which is understood to be underneath (farther along the optical axis from) the scanner 12. FIG. 6 also does not show the other beamlets 6D, 6G of the plurality of beamlets. The other beamlets are understood to be present as well, passing through optical elements similarly as previously described. For example, the second beamlet 4D (and/or any other beamlet of the plurality) can pass through the deflector 6 and scanner 12 toward a coma free point.

The deflector 6 can include a first MEM 61 and a second MEM 62. The first and second MEMs 61, 62 can be arranged along the optical axis 0. Each beamlet 4A, 4D can pass through the first and second MEMs 61, 62 sequentially. The controller may control each of the first and second MEMs 61, 62 through controlling the deflector 6. The controller 110 can address individual elements 61A, 61D, 62A, 62D of each MEM. The first beamlet 4A can be deflected sequentially by the first deflector element 61A of the first MEM 61, followed by the first deflector element 62A of the second MEM 62. The second beamlet 4D can be deflected sequentially by the second deflector element 62A of the first MEM 61, followed by the second deflector element 62D of the second MEM 62.

The deflector can include the first MEM and the second MEM such that, in the beamlet-displaced configuration, the acceptable aberrations point is a minimum aberration point 111 on the virtual plane 210 that includes the coma free point 100, and the first beamlet 4A passes continually through the minimum aberrations point 111. The controller and MEM can be configured such that any of the beamlets 4A, 4D of the plurality may be deflected by the deflector 6 and scanner 12 such that the beamlet passes continually through a minimum aberration point 111.

The first beamlet 4A (or any of the beamlets) can be aligned to an area of interest or hotspot using the first and second MEMs 61, 62 to keep the beamlet on the minimum aberrations point 111. The hexapole correction and stigmatism correction can be optimized. Dynamic correction of the field curvature by the lenslet, in synchronicity with dynamic pre-deflection by the MEMs deflectors, in synchronicity with the scanner 12, can reduce aberrations and/or keep the beamlet passing through the minimum aberrations point.

The minimum aberration point 111, in an embodiment, is a point on the virtual plane 210 that includes the coma free point 100, through which a scanned beamlet can continually pass, the minimum aberration point 111 being such that while the scanned beamlet is focused on a continuous portion of the focal plane, the beamlet maintains a reasonably minimal spot size. The reasonably minimal spot size can be less than 10%, 5%, 2%, or 1% larger than the spot size when the beamlet passes through the coma free point to the center of the field of view in the centered configuration. The continuous portion of the focal plane can be different than the normal field of view.

The minimum aberration point 111 may correspond to the coma free point 100 of the centered configuration.

For an array of beamlets arranged in a virtual ring of 80 µm radius, the dynamic correction of field curvature by the lenslet 300 (and/or array of lenslets), and the dynamic pre-deflection by the deflector 6 using two MEMs in series, can extend the possible shift of a beamlet toward a region of interest (or hotspot) from the regular focal spot by up to approximately 40 µm, and allow a field of view of each beamlet to be approximately 40 µm.

In an embodiment, in the beamlet-displaced configuration, the scanner 12 and deflector 6 are scanned in synchronicity such that the first beamlet 4A passes continually through the minimum aberrations point 111, such as to a displaced first focal spot 45A which is displaced from the regular first focal spot 40A of the centered configuration. It is possible that, as the first beamlet 4A, passing through the minimum aberration point 111, scans the displaced first field of view 405A, the second beamlet 4D passes through the coma free point 100 and scans the regular second field of view 400D.

The deflector 6, scanner 12, and lenslet 300 or a lenslet array may be synchronized, such as by the controller 110. A lenslet array can be configured to correct field curvature aberration of the first beamlet 4A independently of the second beamlet 4D, particularly when the charged particle beam device 1 is in the beamlet-displaced configuration. A lenslet array may be located directly adjacent, such as directly above or directly below the deflector 6.

Generally, the scanner 12 can be configured to scan all the beamlets 4A, 4D simultaneously in synchronicity with each other. In the beamlet-displaced configuration, the deflector 6 can dynamically deflect, in synchronicity with the scanner, one or more of the beamlets (such as the first beamlet), while the deflector 6 statically deflects the other beamlets (including the second beamlet, for example) toward the coma free point. The dynamic deflection by the deflector 6 can direct the one beamlet (such as the first beamlet 4A) such that it passes continually through an acceptable aberrations point 105 and/or a minimum aberration point 111.

Embodiments can include the first and second MEMs configured, in the beamlet-displaced configuration, to dynamically correct astigmatism in synchronicity with the scanning of the scanner. The deflector can include, for each beamlet passing therethrough, at least one deflector element (and/or MEM element), such as two deflector elements (and/or MEM elements). Each MEM element may generate a dipole or higher.

One of or each MEM can be configured to generate an electrical dipole or higher at each deflector element of the deflector 6. The MEM(s) can (each) be configured to simultaneously generate a dipole, quadrupole, and hexapole at each deflector element. For example, each deflector element includes 8 or more poles/electrodes, particularly to generate simultaneously a dipole, quadrupole, and hexapole. Higher order MEMs are also contemplated, such as MEMS which include deflector elements of up to 20 poles/electrodes or even higher, for example.

Each deflector element of the MEM(s) can be configured to generate fields statically and/or dynamically (including superpositions of static fields and dynamic fields), such as can be determined by signals and/or power from the controller. Each deflector element may be configured to be operated, such as by the controller, in unison with or independently of other deflector elements. When there are two MEMs, each beamlet may pass through a unique pair of deflector elements, one from each MEM, and each unique pair of deflector elements may operate dynamically in synchronicity, particularly to minimize aberrations in the beamlet-displaced configuration.

The controller 110 can be configured to control the configuration of the charged particle device 1, such as to switch between the centered configuration and a beamlet-displaced configuration. The controller 110 can select which of the beamlets of the plurality of beamlets is displaced. The controller 110 may control, synchronize, and/or power the scanning of the scanner 12 and the scanning of the deflector 6 (or any one or more elements therein), and optionally, the scanning of the lenslet array (or any one or more lenslets therein).

Further contemplated and disclosed herein are high-speed electronics for the MEMS and/or lenslets. Such high speed electronics may include multiple channels. For example, in controlling an MEM having 8 poles/electrodes, each MEM element may have up to 8 channels controlled, at high speed in synchronicity with the scanner 12, by the controller 110. It may be advantageous to have MEMS with 4 poles, for simplicity.

Figure 7:
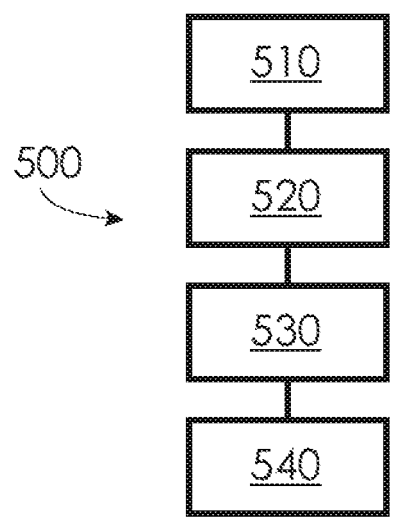
FIG. 7 illustrates a method of operating a charged scanning device, according to embodiments described herein.

FIG. 7 shows a method of operating a charged scanning device 500, according to embodiments described herein. The plurality of beamlets are passed through a deflector and scanner 510. The device is operated in a centered configuration 520, and the device is operated in a beamlet-displaced configuration 530. The beamlets are focused with an objective on a sample 540.

This disclosure is intended to include the following enumerated embodiments, in which references to reference numerals and figures are mentioned to aid in understanding, without the intent of the references or figures to be limiting.

1. A method of operating a charged particle beam device (1), comprising:
    passing each of a plurality of beamlets (4A, 4D) through a deflector (6) and a scanner (12), wherein the beamlets pass through the scanner after passing through the deflector;
    focusing, with an objective lens (10), each of the plurality of beamlets (4A, 4D) on a sample to form a plurality of focal spots (40A, 40D) forming an array, including focusing a first beamlet (4A) on a first spot (40A), and focusing a second beamlet on a second spot (40D);
    in a centered configuration of the device,
        directing, with the deflector (6), each of the plurality of beamlets toward a coma free point (100) on a virtual plane (210) perpendicular to an optical axis, wherein the first spot (40A) is a regular first focal spot (40A) formed by the first beamlet (4A), and
        scanning the scanner 12 such that each of the beamlets scans a regular field of view, including the first beamlet scanning a regular first field of view and the second beamlet scanning a regular second field of view; and
    in a beamlet-displaced configuration (FIG. 4) of the device,
        scanning the scanner such that the first beamlet (4A) passes through an acceptable aberrations point 105 on the virtual plane (210), the first beamlet 4A scanning a displaced first field of view 405A, wherein
            the first spot (40A or 45A) is displaced from the regular first focal spot (40A) to a displaced first focal spot (45A).
    In the beamlet-displaced configuration, the scanner and deflector can be scanned (such as in synchronicity) such that the first beamlet passes through the acceptable aberrations point.

2. The method of operating the charged particle beam device of embodiment 1, wherein,
    in the beamlet-displaced configuration,
        the displaced first field of view (405A) is displaced from the regular first field of view (400A) in a direction substantially perpendicular to the optical axis, and
        the scanner is scanned such that the second beamlet scans the regular second field of view. The scanner can scan each of the beamlets in synchronicity, e.g. so that each respective field of view is simultaneously scanned from each beamlet.

3. The method of operating the charged particle beam device of any preceding embodiment, wherein,
    in the centered configuration, the regular first focal spot (40A) is centered in a regular first field of view (400A) of the first beamlet (4A); and
    in the beamlet-displaced configuration, the displaced first spot (45A) is centered in a displaced field of view of the first beamlet.

4. The method of operating the charged particle beam device of any preceding embodiment, wherein
    in the centered configuration and the beamlet-displaced configuration, the second spot (40D) is centered in a regular second field of view (400D) of the second beamlet.

5. The method of operating the charged particle beam device of any preceding embodiment, wherein
    in the centered configuration, the array is regularly spaced. In the beamlet-displaced configuration, at least one of the beamlets, such as the first beamlet, can be focused at a position displaced from its regular spot.

6. The method of operating the charged particle beam device of any preceding embodiment, wherein
    the centered configuration is such that each focal spot of the array is arranged on a virtual ring; and
    in the beamlet-displaced configuration, the first spot is displaced from the virtual ring.

7. The method of operating the charged particle beam device of any preceding embodiment, wherein
    the deflector includes a MEM configured to generate at least an electrical dipole and an electrical quadrupole at each deflector element (6A, 6D) of the deflector (6); and each deflector element is configured to pass one of the beamlets. The MEM can also be configured to generate a hexapole. The MEM can have 8 poles/electrodes. The MEM can be configured to generate even higher multipoles, such as up to 20.

8. The method of operating the charged particle beam device of any preceding embodiment, wherein
    the acceptable aberrations point is displaced from the coma free point on the virtual plane; wherein
    the coma free point is located in the field of the objective lens.

9. The method of operating the charged particle beam device of any preceding embodiment, wherein
    in the centered configuration and in the beamlet-displaced configuration, each of the beamlets is scanned by the scanner; and
    in the beamlet-displaced configuration, the first beamlet is scanned by the deflector, and
    the second beamlet is statically deflected by the deflector toward the coma free point. The scanner may scan each of the beamlets in synchronicity. The deflector may scan the first beamlet in synchronicity with the scanner.

10. The method of operating the charged particle beam device of any preceding embodiment, further comprising:

passing the first beamlet through a lenslet which corrects field curvature of the first beamlet. The lenslet may be modulated in synchronicity with the scanning of the scanner.

11. The method of operating the charged particle beam device of embodiment 10, wherein
correcting field curvature of the first beamlet is synchronized with the scanning of the scanner and/or the deflector; and the lenslet is scanned in synchronicity with the scanner and/or deflector.

12. The method of operating the charged particle beam device of any preceding embodiment, wherein
the deflector includes a first MEM and a second MEM such that, in the beamlet-displaced configuration,
the acceptable aberrations point is a minimum aberration point, and
the first beamlet passes continually through the minimum aberration point during scanning of the scanner and scanning of the deflector.

13. The method of operating the charged particle beam device of any preceding embodiment, wherein
in the beamlet-displaced configuration, scanning the deflector includes:
scanning the first beamlet so as to dynamically deflect the first beamlet, while statically deflecting the second beamlet.

14. The method of operating the charged particle beam device of any preceding embodiment, wherein,
in the beamlet-displaced configuration, the scanner and deflector are scanned in synchronicity such that the first beamlet passes continually through the acceptable aberrations point.

15. A charged particle beam device comprising:
a charged particle source and a multi-aperture plate, the multi-aperture plate including a plurality of apertures, each aperture for passing a beamlet, the multi-aperture plate forming a plurality of beamlets of charged particles;
a deflector;
a scanner;
an objective lens configured to focus the plurality of beamlets on a plurality of focal spots to form an array, including a first beamlet focused on a first spot and a second beamlet focused on a second spot; and
wherein
the charged particle beam device has a centered configuration and a beamlet-displaced configuration; wherein
in the centered configuration,
the deflector is configured to direct each of the plurality of beamlets toward a coma free point on a virtual plane perpendicular to an optical axis, and
the plurality of focal spots include the first spot which is a regular first focal spot formed by the first beamlet; and
in the beamlet-displaced configuration,
the scanner and deflector are each configured to be scanned such that
the deflector deflects the first beamlet through an acceptable aberrations point on the virtual plane, and
the first beamlet scans a displaced first field of view,
wherein
the first spot is displaced from the regular first focal spot to a displaced first focal spot.

16. The charged particle beam device of embodiment 15, further including
a lenslet array configured to correct field curvature aberration of the first beamlet independently of the second beamlet, when the charged particle beam device is in the beamlet-displaced configuration.

17. The charged particle beam device of embodiment 15 or 16, wherein
the scanner is configured to scan each of the plurality of beamlets simultaneously in synchronicity; and
in the beamlet-displaced configuration,
the deflector is configured to dynamically deflect, in synchronicity with the scanner, the first beamlet, and the deflector is configured to statically deflect the second beamlet toward the coma free point.

18. The charged particle beam device of embodiment 15, 16, or 17, wherein
the deflector includes a first MEM and a second MEM configured such that,
in the beamlet-displaced configuration, the acceptable aberrations point is a minimum aberration point, and
the deflector and the scanner are configured for synchronization such that the first beamlet passes continually through the minimum aberration point.

19. The charged particle beam device of embodiment 15, 16, or 17 or 18, wherein
the deflector includes a first MEM and a second MEM, and
the first and second MEMs are configured, in the beamlet-displaced configuration, to dynamically correct astigmatism in synchronicity with the scanning of the scanner. Each MEM may be configured to generate a dipole, a quadrupole, a hexapole, and combinations thereof. Each MEM may also generate higher multipoles, such as up to 20.

20. The charged particle beam device of any of embodiment 15-19, including
a controller which controls a configuration of the charged particle beam device, wherein the scanner and the deflector are controlled by the controller; and wherein the controller synchronizes the scanner and the deflector.

21. The charged particle beam device of any of embodiment 15-20, wherein
the deflector includes a MEM configured to generate an electrical dipole or higher (such as a dipole, quadrupole, and hexapole); and
scanning the deflector is dynamically deflecting at least one beamlet with the deflector, such as in synchronicity with the scanning of the scanner.

While the foregoing is directed to embodiments of the disclosure, other and further embodiments of the disclosure may be devised without departing from the basic scope thereof, and the scope thereof is determined by the claims that follow.

The invention claimed is:
1. A method of operating a charged particle beam device, comprising:
passing each of a plurality of beamlets through a deflector and a scanner, wherein the beamlets pass through the scanner after passing through the deflector;
focusing, with an objective lens, each of the plurality of beamlets on a sample to form a plurality of focal spots forming an array, including focusing a first beamlet on a first spot, and focusing a second beamlet on a second spot;
in a centered configuration of the device, directing, with the deflector, each of the plurality of beamlets toward a coma free point on a virtual plane perpendicular to an optical axis, wherein the first spot is a regular first focal spot formed by the first beamlet, and scanning the scanner such that each of the beamlets scans a regular field of view, including the first beamlet scanning a regular first field of view and the second beamlet scanning a regular second field of view; and in a beamlet-displaced configuration of the device,
scanning the scanner such that the first beamlet passes through an acceptable aberrations point on the virtual plane, the first beamlet scanning a displaced first field of view, wherein
the first spot is displaced from the regular first focal spot to a displaced first focal spot.

2. The method of operating the charged particle beam device of claim 1, wherein,
in the beamlet-displaced configuration,
the displaced first field of view is displaced from the regular first field of view in a direction substantially perpendicular to the optical axis, and
the scanner is scanned such that the second beamlet scans the regular second field of view.

3. The method of operating the charged particle beam device of claim 1, wherein,
in the centered configuration, the regular first focal spot is centered in a regular first field of view of the first beamlet; and
in the beamlet-displaced configuration, the displaced first spot is centered in a displaced field of view of the first beamlet.

4. The method of operating the charged particle beam device of claim 1, wherein
in the centered configuration and the beamlet-displaced configuration, the second spot is centered in a regular second field of view of the second beamlet.

5. The method of operating the charged particle beam device of claim 1, wherein
in the centered configuration, the array is regularly spaced.

6. The method of operating the charged particle beam device of claim 1, wherein
the centered configuration is such that each focal spot of the array is arranged on a virtual ring; and
in the beamlet-displaced configuration, the first spot is displaced from the virtual ring.

7. The method of operating the charged particle beam device of claim 1, wherein
the deflector includes a MEM configured to generate at least an electrical dipole and an electrical quadrupole at each deflector element of the deflector; and each deflector element is configured to pass one of the beamlets.

8. The method of operating the charged particle beam device of claim 1, wherein
the acceptable aberrations point is displaced from the coma free point on the virtual plane; wherein
the coma free point is located in the field of the objective lens.

9. The method of operating the charged particle beam device of claim 1, wherein in the centered configuration and in the beamlet-displaced configuration, each of the beamlets is scanned by the scanner; and
in the beamlet-displaced configuration, the first beamlet is scanned by the deflector, and
the second beamlet is statically deflected by the deflector toward the coma free point.

10. The method of operating the charged particle beam device of claim 1, further comprising:
passing the first beamlet through a lenslet which corrects field curvature of the first beamlet.

11. The method of operating the charged particle beam device of claim 10, wherein
correcting field curvature of the first beamlet is synchronized with the scanning of the scanner and/or the deflector; and the lenslet is scanned in synchronicity with the scanner and/or deflector.

12. The method of operating the charged particle beam device of claim 1, wherein
the deflector includes a first MEM and a second MEM such that, in the beamlet-displaced configuration,
the acceptable aberrations point is a minimum aberration point, and
the first beamlet passes continually through the minimum aberration point during scanning of the scanner and scanning of the deflector.

13. The method of operating the charged particle beam device of claim 1, wherein
in the beamlet-displaced configuration, scanning the deflector includes:
scanning the first beamlet so as to dynamically deflect the first beamlet, while statically deflecting the second beamlet.

14. The method of operating the charged particle beam device of claim 1, wherein, in the beamlet-displaced configuration, the scanner and deflector are scanned in synchronicity such that the first beamlet passes continually through the acceptable aberrations point.

15. A charged particle beam device comprising:
a charged particle source and a multi-aperture plate, the multi-aperture plate including a plurality of apertures, each aperture for passing a beamlet, the multi-aperture plate forming a plurality of beamlets of charged particles;
a deflector;
a scanner;
an objective lens configured to focus the plurality of beamlets on a plurality of focal spots to form an array, including a first beamlet focused on a first spot and a second beamlet focused on a second spot; and
wherein
the charged particle beam device has a centered configuration and a beamlet-displaced configuration; wherein
in the centered configuration,
the deflector is configured to direct each of the plurality of beamlets toward a coma free point on a virtual plane perpendicular to an optical axis, and
the plurality of focal spots include the first spot which is a regular first focal spot formed by the first beamlet; and
in the beamlet-displaced configuration,
the scanner and deflector are each configured to be scanned such that
the deflector deflects the first beamlet through an acceptable aberrations point on the virtual plane, and
the first beamlet scans a displaced first field of view,
wherein
the first spot is displaced from the regular first focal spot to a displaced first focal spot.

16. The charged particle beam device of claim 15, further including a lenslet array configured to correct field curvature aberration of the first beamlet independently of the second beamlet, when the charged particle beam device is in the beamlet-displaced configuration.

17. The charged particle beam device of claim 15, wherein
the scanner is configured to scan each of the plurality of beamlets simultaneously in synchronicity; and
in the beamlet-displaced configuration,
the deflector is configured to dynamically deflect, in synchronicity with the scanner, the first beamlet, and
the deflector is configured to statically deflect the second beamlet toward the coma free point.

18. The charged particle beam device of claim 15, wherein
the deflector includes a first MEM and a second MEM configured such that,
in the beamlet-displaced configuration, the acceptable aberrations point is a minimum aberration point, and
the deflector and the scanner are configured for synchronization such that the first beamlet passes continually through the minimum aberration point.

19. The charged particle beam device of claim 15, wherein
the deflector includes a first MEM and a second MEM, and
the first and second MEMs are configured, in the beamlet-displaced configuration, to dynamically correct astigmatism in synchronicity with the scanning of the scanner.

20. The charged particle beam device of claim 15, including
a controller which controls a configuration of the charged particle beam device, wherein the scanner and the deflector are controlled by the controller; and wherein the controller synchronizes the scanner and the deflector.

21. The charged particle beam device of claim 15, wherein
the deflector includes a MEM configured to generate an electrical dipole or higher; and
scanning the deflector is dynamically deflecting at least one beamlet with the deflector, such as in synchronicity with the scanning of the scanner.

* * * * *